(12) United States Patent
Steiner et al.

(10) Patent No.: US 11,183,259 B2
(45) Date of Patent: *Nov. 23, 2021

(54) ADAPTING FLASH MEMORY PROGRAMMING PARAMETERS FOR HIGH ENDURANCE AND STEADY PERFORMANCE

(71) Applicant: Kioxia Corporation, Tokyo (JP)

(72) Inventors: Avi Steiner, Kiriat Motzkin (IL); Hanan Weingarten, Herzliya (IL); Yasuhiko Kurosawa, Fujisawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/866,483

(22) Filed: May 4, 2020

(65) Prior Publication Data
US 2020/0265910 A1     Aug. 20, 2020

Related U.S. Application Data

(63) Continuation of application No. 15/904,893, filed on Feb. 26, 2018, now Pat. No. 10,643,730.

(51) Int. Cl.
*G11C 29/02* (2006.01)
*G11C 16/34* (2006.01)
*G11C 16/04* (2006.01)

(52) U.S. Cl.
CPC ........ *G11C 29/028* (2013.01); *G11C 16/3495* (2013.01); *G11C 16/0483* (2013.01)

(58) Field of Classification Search
CPC .............. G11C 29/028; G11C 16/3495; G11C 16/0483; G11C 16/10; G11C 2211/5644; G11C 29/021; G11C 29/44; G11C 11/5628; G11C 2029/0409
See application file for complete search history.

(56) References Cited

U.S. PATENT DOCUMENTS

| | | | |
|---|---|---|---|
| 8,879,325 B1 | 11/2014 | Bar et al. | |
| 9,069,659 B1 | 6/2015 | Sabbag et al. | |
| 9,195,592 B1 | 11/2015 | Weingarten et al. | |
| 10,157,677 B2 * | 12/2018 | Marelli | G11C 29/50016 |
| 10,643,730 B1 * | 5/2020 | Steiner | G11C 29/021 |
| 2012/0216085 A1 | 8/2012 | Weingarten et al. | |
| 2013/0339586 A1 | 12/2013 | Weingarten et al. | |
| 2016/0070643 A1 * | 3/2016 | Shen | G11C 16/349 711/103 |
| 2016/0180958 A1 * | 6/2016 | Raghunathan | G06F 12/0246 365/185.24 |
| 2016/0378400 A1 * | 12/2016 | Yang | G11C 16/3495 711/156 |
| 2017/0092371 A1 | 3/2017 | Harari | |

* cited by examiner

*Primary Examiner* — David Lam
(74) *Attorney, Agent, or Firm* — Foley & Lardner LLP

(57) ABSTRACT

The present embodiments relate to methods for maintaining steady and high performance programming of non-volatile memory devices such as NAND-type flash devices. According to certain aspects, embodiments provide adaptive control of programming parameters over the lifespan of a NAND flash device so as to maintain write performance and obtain high endurance.

20 Claims, 12 Drawing Sheets

FIG. 3
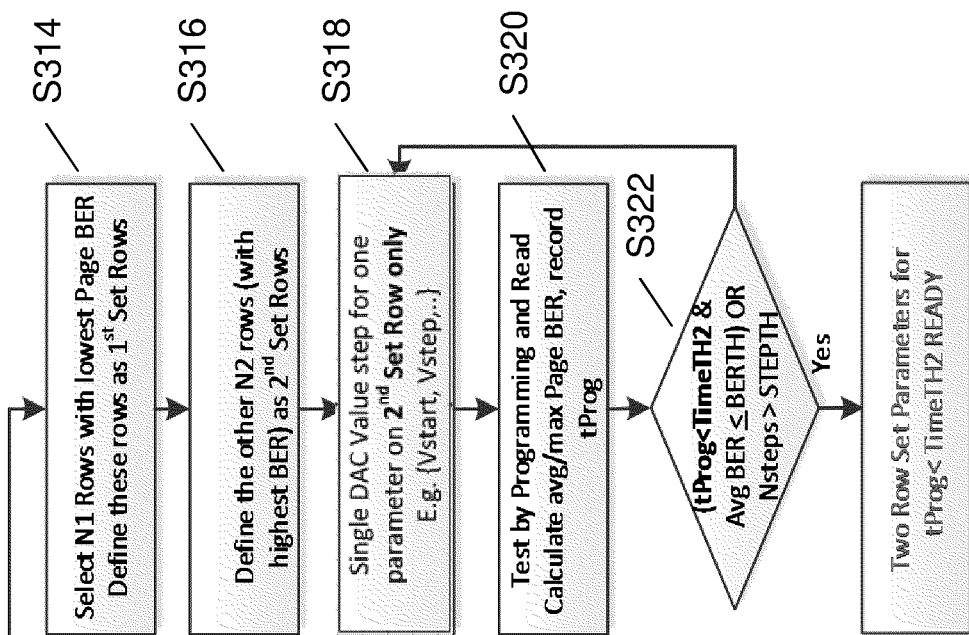
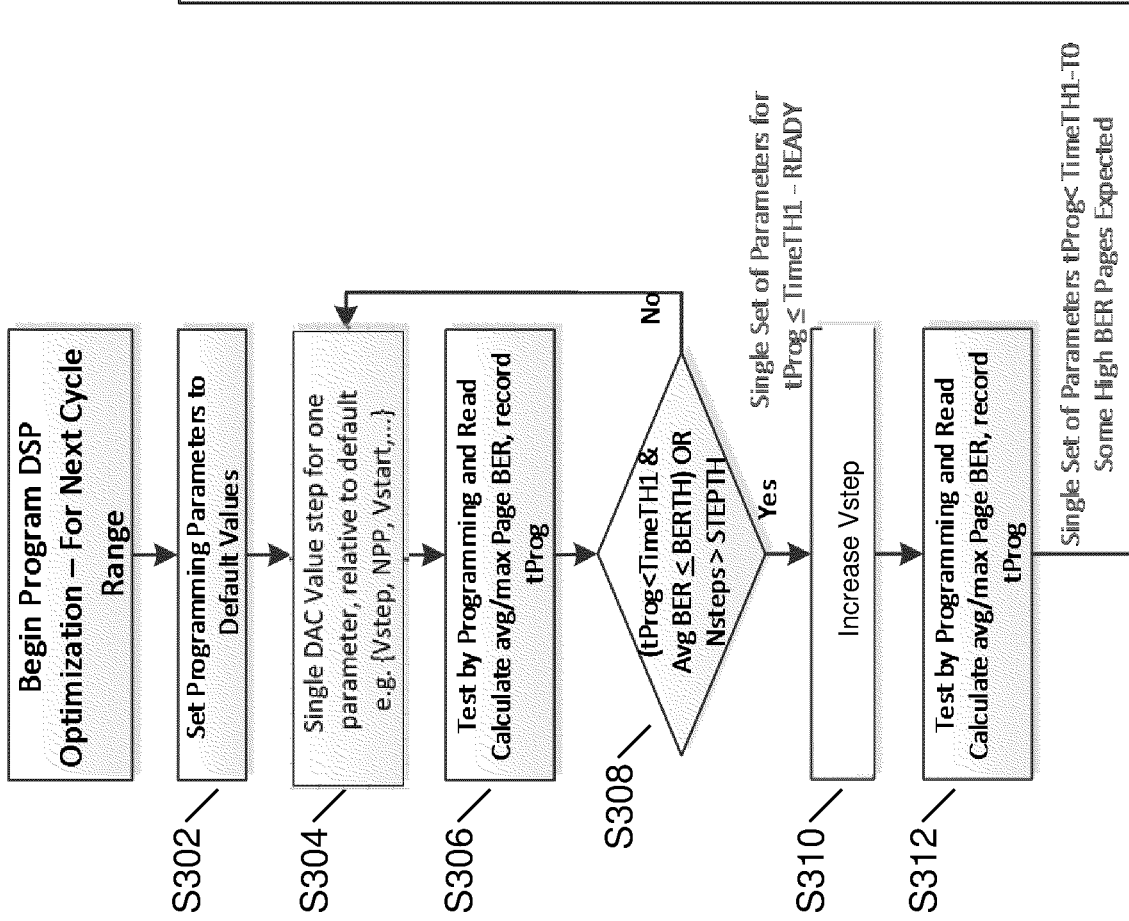

ADAPTING FLASH MEMORY PROGRAMMING PARAMETERS FOR HIGH ENDURANCE AND STEADY PERFORMANCE

CROSS-REFERENCE TO RELATED APPLICATIONS

The present application claims priority to U.S. patent application Ser. No. 15/904,893, filed Feb. 26, 2018, now U.S. Pat. No. 10,643,730, the contents of which are incorporated herein by reference in their entirety.

TECHNICAL FIELD

The present embodiments relate generally to memory devices and more particularly to techniques for adapting programming parameters for NAND flash memory devices so as to provide high endurance and steady programming performance.

BACKGROUND

As the number and types of computing devices continues to expand, so does the demand for memory used by such devices. Memory includes volatile memory (e.g. RAM) and non-volatile memory. One popular type of non-volatile memory is flash memory or NAND-type flash. A NAND flash memory array includes rows and columns (strings) of cells. A cell may include a transistor.

During a read operation, an entire row/page of the NAND flash memory array is read. This is done by applying a bias voltage to all rows not being read and a reference threshold voltage to the row that should be read. The bias voltage allows the transistor of the NAND flash memory array to fully conduct. The cells lying on the row being read will conduct only if the threshold voltage is sufficiently high to overcome the trapped charge in the floating gate. A sense amplifier is connected to each string which measures the current through the string and outputs either a "1" or a "0" depending whether the current passed a certain threshold.

Typically, a programming operation includes a process of multiple small charge injection steps. A charge may be injected to a cell by applying a voltage pulse (Vpulse), starting at a voltage Vstart, to the row being programmed and setting the gate voltages of all other transistors in the string to a bias voltage (Vbias). After applying a voltage pulse, the programmed cell is read (using the procedure described above) and compared to the desired programming voltage. If the desired programming voltage is reached, the programming ends. Else, additional pulses are provided—until reaching the desired programming voltage or until reaching a maximum number of pulses (NPP). If, after the maximum number of pulses is used, there remain cells that did not pass the verify test (i.e. they were not programmed to the desired programming voltage), a program error (or failure) can be declared. The programming process includes increasing the level of the voltage pulses (Vpulse) by a voltage increment (Vstep) in a process known as Incremental Step Pulse Programming (ISPP).

The NAND flash memory programming parameters described above (e.g. Vbias, Vstep, Vstart, and NPP) and used in the ISPP process are typically defined to provide a desired trade-off between speed and accuracy. These programming parameters are generally fixed for each device of a common memory product type and used for programming during the entire lifetime of the device.

SUMMARY

The present embodiments relate to methods for maintaining steady and high performance programming of non-volatile memory devices such as NAND-type flash devices. According to certain aspects, embodiments provide adaptive control of programming parameters over the lifespan of a NAND flash device so as to maintain write performance and obtain high endurance.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein:

FIG. 3 is a flowchart illustrating an example methodology for adapting programming parameters of a flash memory device according to embodiments;

DETAILED DESCRIPTION

According to certain aspects, the present embodiments relate to techniques for obtaining high endurance and high performance programming of NAND-type flash memory devices.

As set forth above, a programming operation of a NAND flash device includes a process of multiple small charge injection steps. A charge may be injected to a cell by applying a voltage pulse (Vpulse), to the row being programmed and setting the gate voltages of all other transistors in the string to a bias voltage (Vbias). After applying a voltage pulse, the programmed cell is read (using the read procedure also described above) and compared to the desired programming voltage threshold. If the desired programming voltage is reached, the programming ends.

Figure 1:
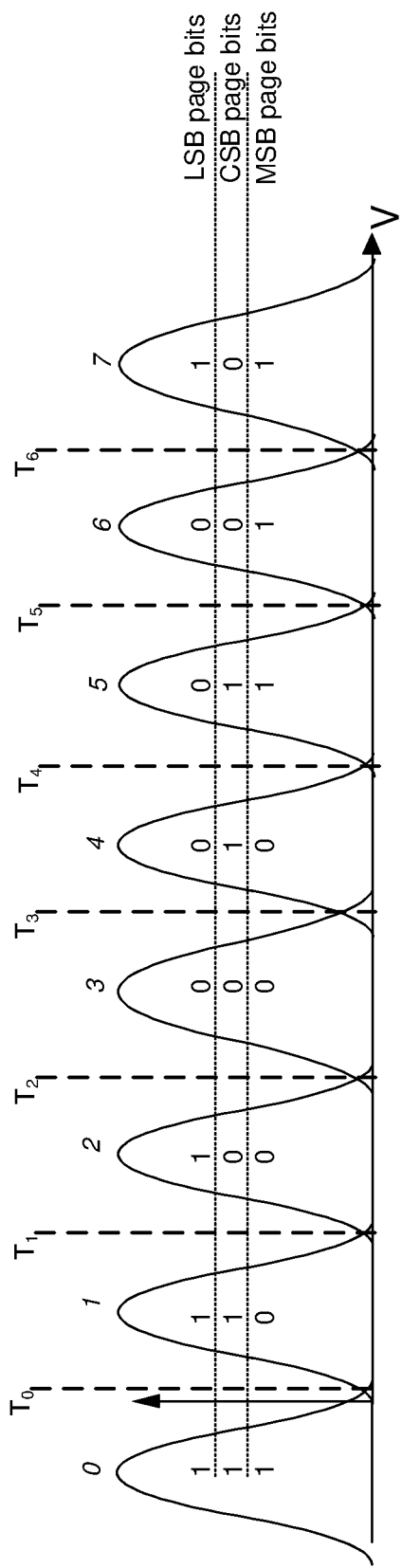
FIG. 1 illustrates threshold voltage distribution in a conventional three bpc flash device.

FIG. 1 illustrates a voltage threshold distribution of a three bits per cell (bpc) flash memory device. The voltage threshold (VT) distribution includes eight lobes. An MSB page read requires using thresholds T0, T4. For reading CSB pages the read thresholds T1, T3 and T5 are used. For reading LSB pages the read thresholds T2 and T6 have to be used. The lower most distribution is known as the erase level.

The lobes shown in FIG. 1 are non-overlapping, however in practice the lobes may overlap. The overlapping can be due to the retention effect. More particularly, the repeated programming and erasing of flash memory cells (i.e. P/E cycles) cause charges to be trapped in the flash memory cells. These charges can reduce the cell program time (tProg). However, these charges can also introduce errors in the programming and reading processes.

In this regard, the present Applicant recognizes that one factor in programming performance is endurance. Impacting this factor is the fact that, given the same fixed programming parameters used over the lifetime of a flash memory device, program time and corresponding bit error rates (BERs) change as function of the number of P/E cycles. More particularly, at high P/E cycles, the program time (tProg) is usually much shorter than the tProg of the first few P/E cycle (as much as approximately 20% lower), and it also results in higher BER.

Therefore, the present Applicant further recognizes that the program time of NAND flash devices governs their achievable write performance. So in order to maintain high endurance at a steady and stable write performance it is desirable to be able to adapt the programming parameters over the lifetime of the devices, rather than being fixed as in conventionally devices. The adaptation can be done according to effective cycling estimation, or according to a fixed set of cycle ranges.

Figure 2:
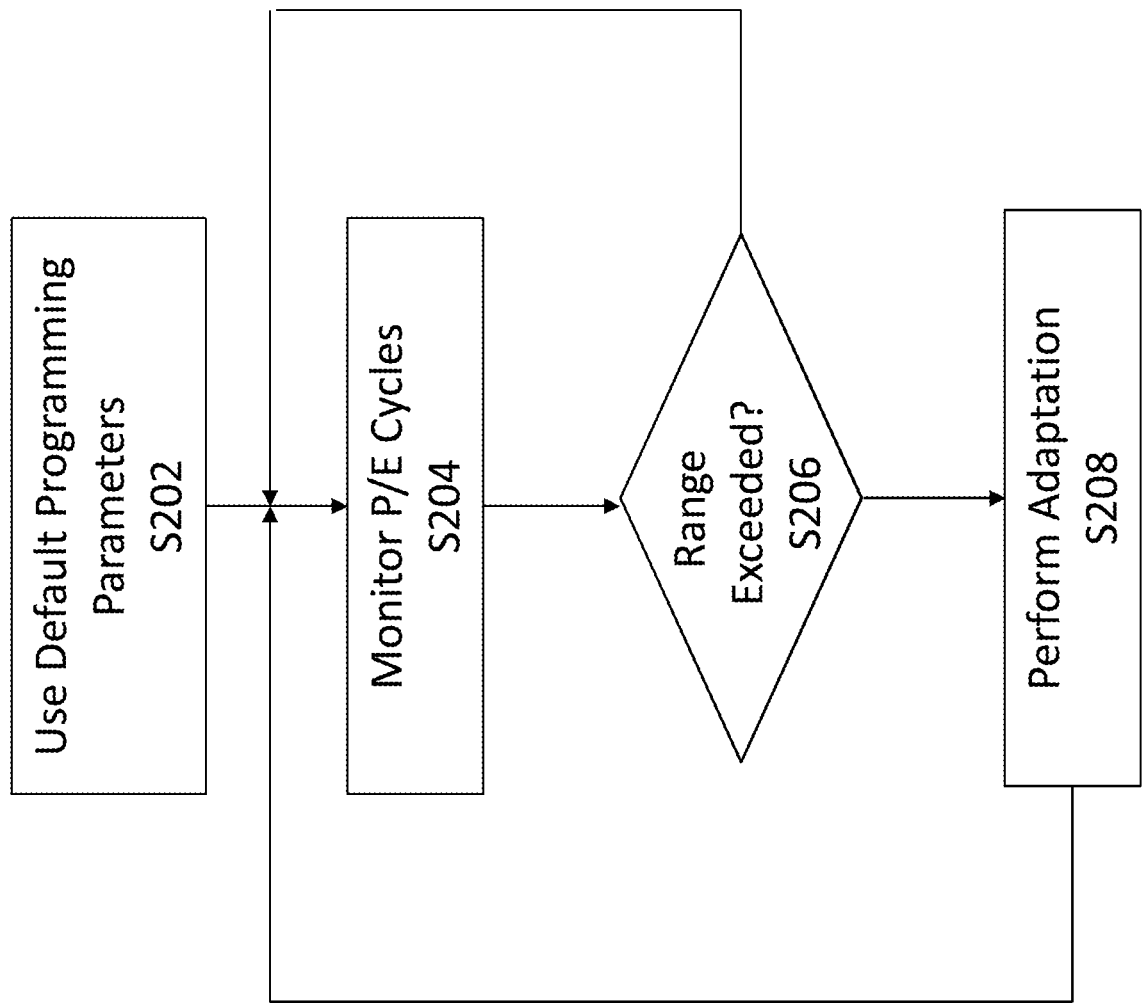
FIG. 2 is a flowchart illustrating an example methodology of operating a flash memory according to embodiments.

FIG. 2 is an example methodology for adaptive programming of a NAND flash memory device according to embodiments.

In a first step S202, which can be done at the manufacturing stage for example, the NAND programming parameters (e.g., any or all of the parameters Vbias, Vstep, Vstart, and NPP described above) are set to their default values.

Thereafter, during operation of the memory device, the controller monitors the number of P/E cycles experienced by each block of the memory in step S204. This can be done by keeping a count of the actual number of P/E cycles that the memory has undergone. Alternatively, an equivalent P/E cycles count can be estimated according to the last programming result. The estimate can be based on the average programming time and/or on the number of errors following the programming operation. In some cases there may be a strong correspondence between the number of errors during the programming, and the wear level. Example methods for estimating the effective P/E cycles that can be used in the present embodiments are disclosed in U.S. Patent Publ. No. 2012/0216085, the contents of which are incorporated herein by reference in their entirety.

The number of P/E cycles for the memory is compared to a threshold in step S206 and if the threshold is exceeded, the programming parameters for the memory are adapted in step S208. For example, the programming parameters can be adapted every 1000 cycles, or any other suitable number of cycles. It should be noted that there can be many ways that monitoring and adapting a memory device can be performed, perhaps depending on the composition of the particular memory device. Where the memory device includes or is composed of only a single die comprising a plurality of blocks, in one possible embodiment, the number of cycles is monitored and adaptation is performed for each block separately. In another possible embodiment, adaptation is triggered whenever a single block reaches the threshold number of cycles, and adapting parameters is performed for only a single representative block or all blocks separately. Alternatively, where the memory device includes a plurality of dies, with each die including a plurality of blocks, monitoring and adaptation of programming parameters can be performed for each die separately. However, within each die, monitoring and adaptation can be performed for single representative blocks or each block separately as described in any of the single die example embodiments above.

One example method for programming parameters adaptation as can be performed in step S208 in FIG. 2 is described in connection with the flowchart of FIG. 3.

In this example, the process begins in step S302 by setting the NAND programming parameters (e.g., any or all of the parameters Vbias, Vstep, Vstart, and NPP described above) to their default values (e.g. parameters set by the manufacturer), or any other predetermined initial values.

In step S304, the optimization includes changing one or more of the programming parameters by a fixed step size (for example, measured in DAC values). In some embodiments, only one parameter is changed at each interval while the other parameters remain fixed. In other embodiments, all of the parameters are incrementally changed at the same time. The change in parameters can initially be made in a direction that should be expected to lower the BER. For example, the programming parameter Vstep for the programming pulse voltage step can be increased by a fixed amount. In subsequent steps, other parameters such as Vstart can be increased by designated steps of one DAC value or more. The change can be made in a direction that can be expected to assist in satisfying the thresholds described in connection with step S308, as will become more apparent from the below.

In step S306, after the change of programming parameters, an entire flash memory block is programmed (i.e. all of the pages/rows of a block) using those changed parameters, and the controller measures the programming time tProg. The controller also reads the data back and determines the BER for the block. In one example, the data that is read back is compared to the original set of program data to find any differences between them to determine the BER for the memory block. In another example, the number of errors that are corrected using error correction codes (ECC) are tracked and used to determine the BER.

It should be noted that any suitable form of data can be used during the programming operation according to the present embodiments. In one example, the programming data is a set of pseudo-random data. In another example, such as in cases where the adaptation of programming parameters does not introduce any risk of elevated BER during programming, user data can be used for the programming operation. This is usually possible in embodiments where adaptation starts from the default parameters.

In step S308, it is determined if all programming performance conditions are met. In this example, the programming performance conditions are that average tProg must be less than a threshold programming time TimeTH1 and the average BER over all pages of the block must be below a target defined by BERTH. If both of the performance conditions are not met, and if the number of optimization steps does not exceed a threshold number STEPTH, flow returns to S304 where the programming parameters are changed in a direction that would be expected to improve the chances of the programming performance conditions being met at the next step.

Otherwise, at this point, a single set of programming parameter values (e.g., values of the parameters Vbias, Vstep, Vstart, and NPP described above) has been obtained with a modified tProg corresponding to the target programming time TimeTH1. This tProg can be higher or lower than the default tProg, according to system requirements, as will become more apparent from the descriptions below. However, it should be apparent that this will cause the programming time for the memory block to be more stable across the lifespan of the device.

In some embodiments, the programming parameter adaptation process for the entire memory block at this cycle range can end at this point. In other embodiments, further adaptation is performed to obtain stable programming performance between row-sets in the memory block, as is shown in FIG. 3.

Returning to FIG. 3, the next adaptation flow beginning in step S310 in these embodiments is to change only a single programming parameter such as the pulse voltage step Vstep, or any other programming parameter change that accelerates the average tProg by another T0 below TimeTH1. Usually, the change in Vstep which lowers the programming time also increases average BER and maximal BER for the block quite significantly.

More particularly, for example, in a next step S312, the entire flash memory block is programmed (i.e. all of the pages/rows of a block) using the set of programming parameters obtained after step S308, except with the increased Vstep parameter from step S310. After programming, the controller measures the BER of every page using the process described above in connection with step S306, for example.

In a next step S314, the set of N1 rows of the block with the lowest BER as determined in step S312 is identified. A second row-set of the block with the higher BER includes N2 rows, as identified in step S316.

In this example, a next step S318 is to perform an adaptation of the programming parameters for only the second set of N2 rows in step S318. As in step S304, this includes changing one or more of the programming parameters by a fixed step size (for example, measured in DAC values), for example in a direction which should lower BER of the N2 rows.

The next step S320 includes performing a full block programming, where the programming parameters for the first set of N1 rows are fixed with their values from the first adaptation after step S308, while the programming parameters for the other set of N2 rows are modified as in step S318.

As determined in S322, similarly as in step S308, when all programming performance conditions are met, the optimization terminates. In this example, the programming performance conditions include that the average tProg for the entire block must be lower than a threshold TimeTH2, and the average BER for the block must be lower than a target BERTH. If both conditions are not satisfied, and if the number of optimization steps does not exceed STEPTH, the flow returns to step S318. If the number of steps exceeds STEPTH, then the optimization of the N2 rows fails, and the controller may revert the programming parameters for those rows to the previous successful set or parameters from step S308, or to the NAND default parameters.

It should be noted that the above methodology for adapting row-sets is not limited to identifying only two row-sets N1 and N2, and only separately adapting two row sets. Rather, the adaptation process can be performed separately for as many row-sets as desired.

Figure 4:
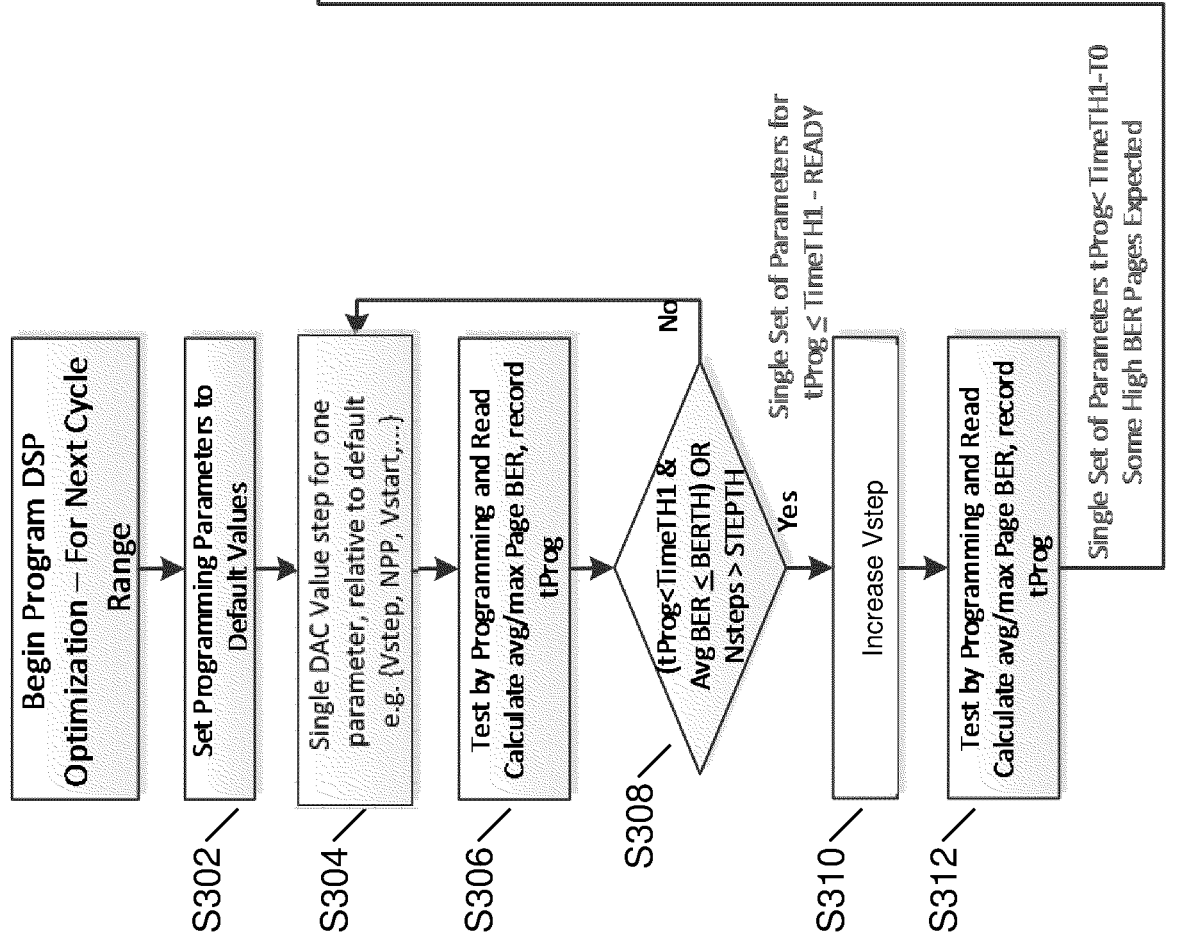
FIG. 4 is a flowchart illustrating another example methodology for adapting programming parameters of a flash memory device according to embodiments.

Additionally or alternatively, in case the program time change and its corresponding BER have the same typical values on all devices of same process node, it may be possible to use a pre-defined set of row-sets, and thus avoid the need to estimate the BER for selection of the row sets. A flowchart illustrating an example adaptation methodology according to this simplified approach is shown in FIG. 4

As can be seen, in this example, all the steps from the method of FIG. 3 can be the same, except that steps S314 and S316 are replaced by step S402, in which the pre-defined row-sets are determined already, for example by an offline optimization over a database of devices. The optimization of parameters in this offline process can be similar to the process described in connection with FIG. 3.

Example aspects of how thresholds for tProg and BER thresholds (i.e. TimeTH1 and BERTH) can be selected or determined for use in performing adaptation such as in the example adaptation methods described above will become apparent from the following.

Figure 5A:
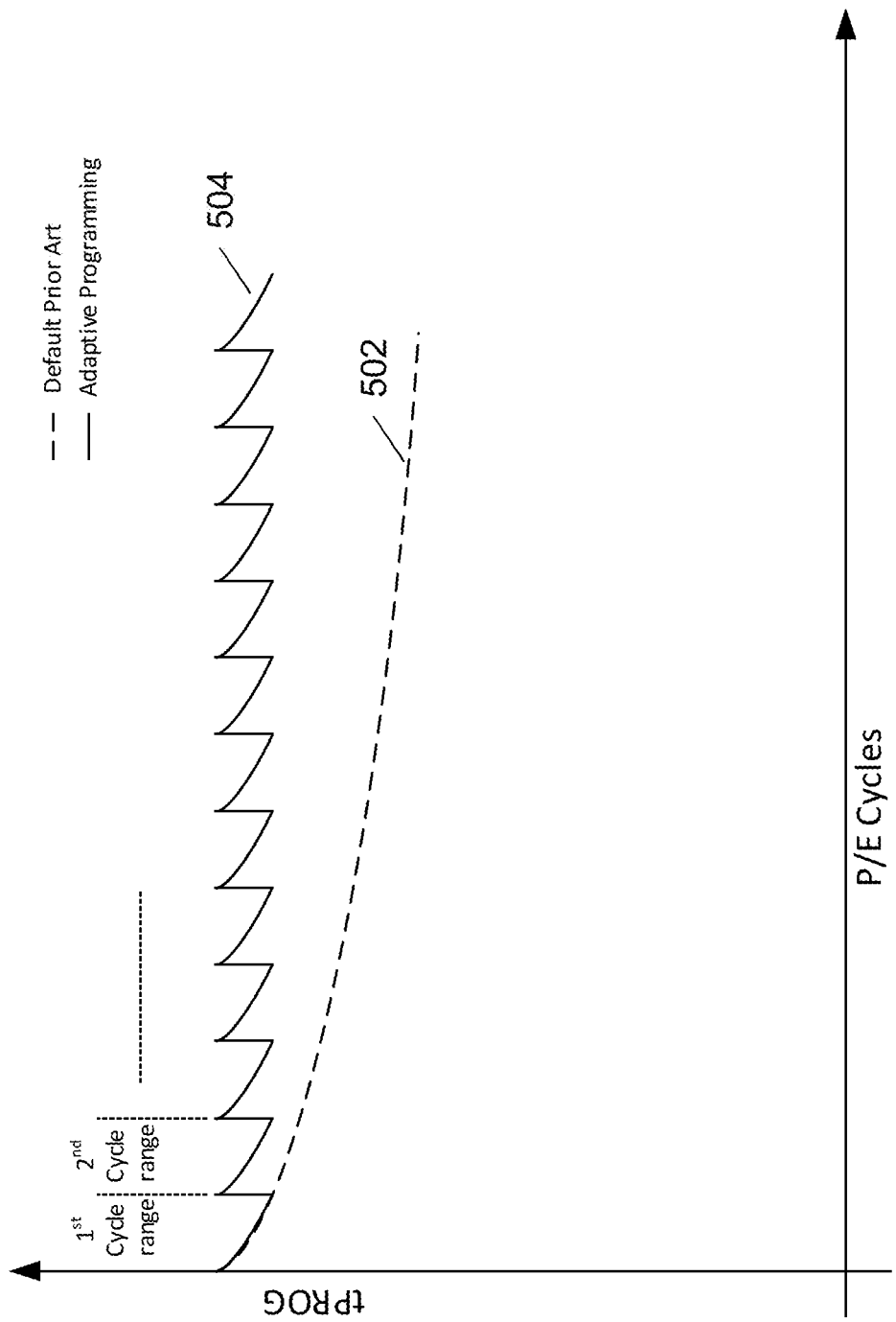
FIGS. 5A and 5B are diagrams illustrating example aspects of adapting programming parameters of a flash memory device using the example methodologies of the present embodiments.
Figure 5B:
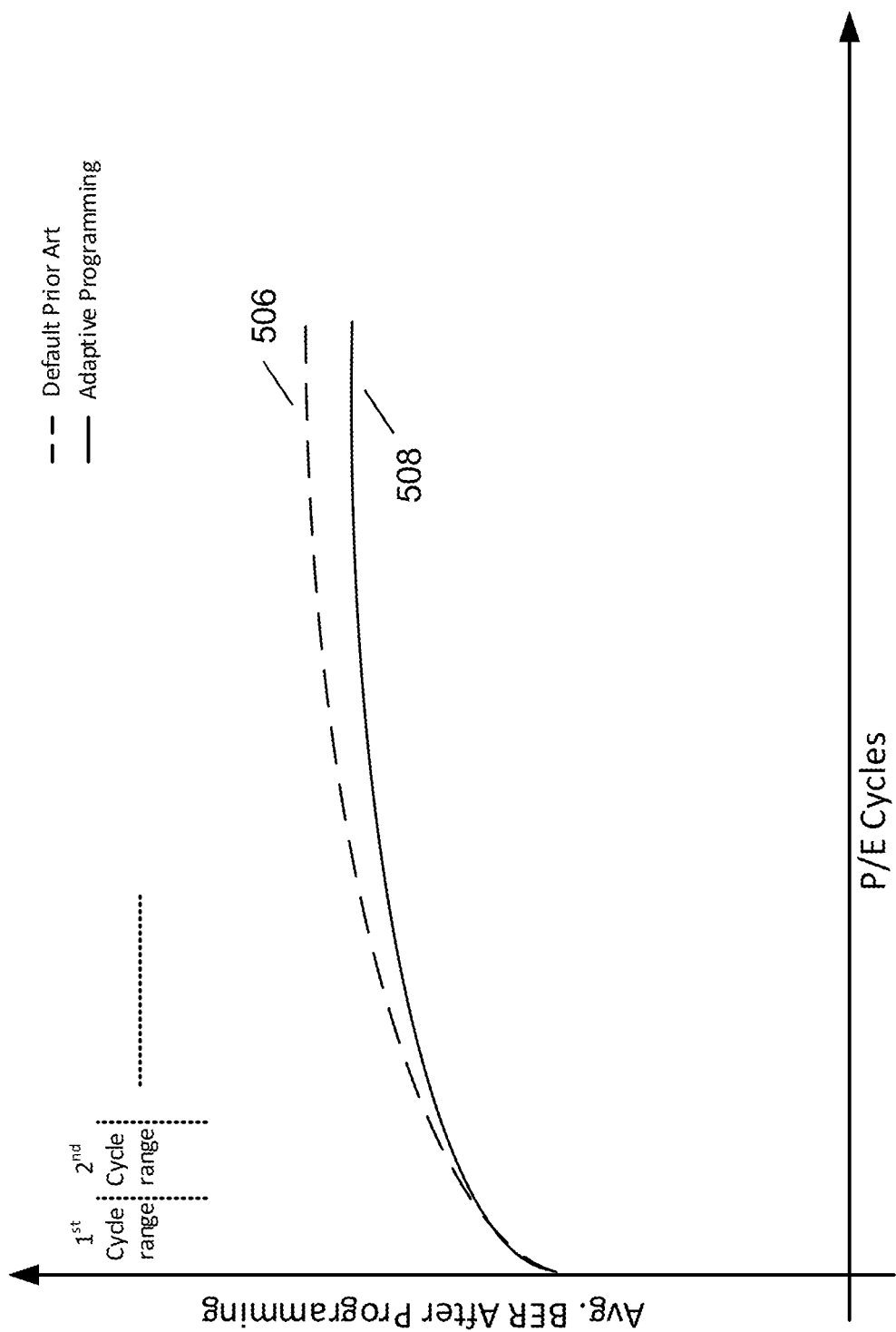

In this regard, and as set forth above, controlling the programming parameters as a function of the effective P/E cycles can result in high endurance with steady write performance. As shown in FIGS. 5A and 5B, as the memory device ages, and as the number of P/E cycles grows, with a fixed set of programming parameters as shown in curves 502 and 506 respectively, the programming time is reduced over time, and the resulting programming BER usually increases much faster. With adaptive programming according to the present embodiments, the controller changes the parameters after every fixed number of cycles, such that programming speed will remain steady as shown in curve 504, while the corresponding BER will more moderately increase as function of P/E cycles, in contrast to the default programming, as shown in curve 508.

To obtain the results shown in FIGS. 5A and 5B, the threshold for tProg (i.e. TimeTH1) used in the methods shown in FIGS. 3 and 4 is set in accordance with the programming performance achieved using the default programming parameters at the start of the memory device's life and the threshold for BER (i.e. BERTH) is configured to meet the error levels obtained with the default programming.

Another adaptation approach is to set the thresholds for tProg and BER (i.e. TimeTH1 and BERTH) so as to accelerate the default programming time at the start of the device's life, at the expense of having a higher average BER. In this example, and using the adaptive programming methodologies of the present embodiments, the BER increase is mild, and the overall achievable endurance is increased.

Figure 6A:
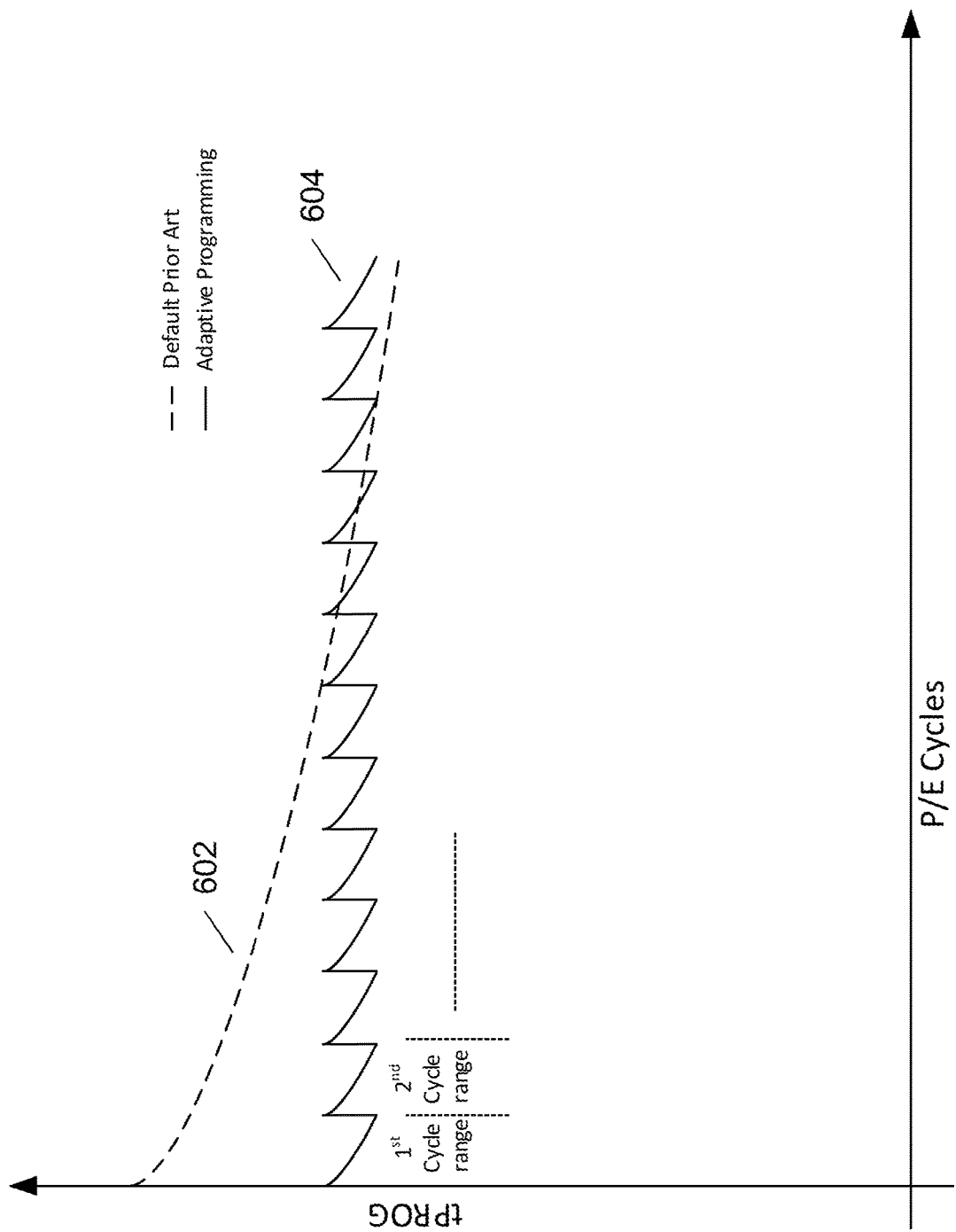
FIGS. 6A and 6B are diagrams illustrating further example aspects of adapting programming parameters of a flash memory device using the example methodologies of the present embodiments.
Figure 6B:
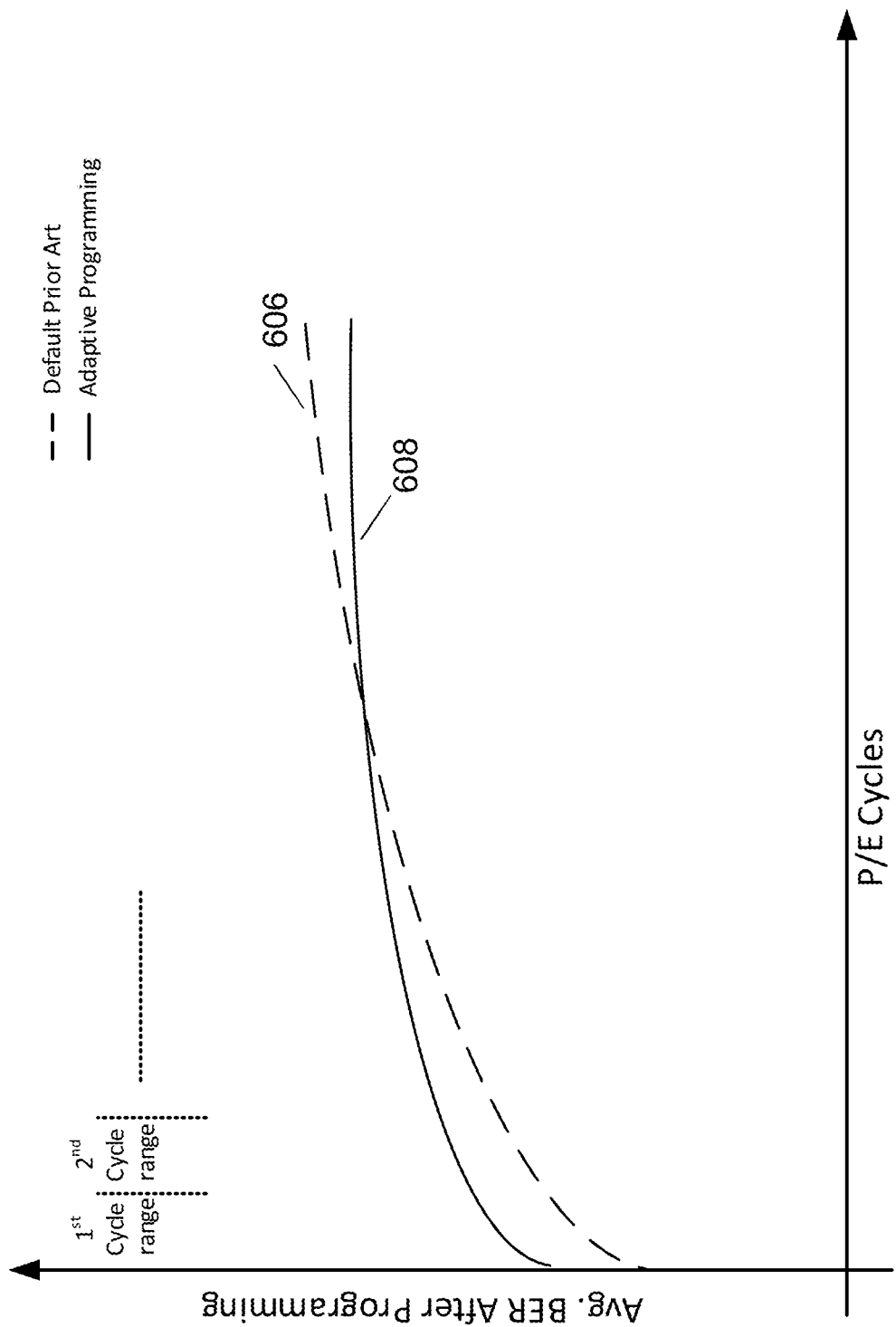

For example, FIG. 6A shows an example of setting the thresholds so as to obtain accelerated programming at the start of life in curve 604 as compared to the default programming in curve 602. FIG. 6B shows the corresponding BER as a function of the P/E cycles for accelerated programming at the start of life (curve 608), as compared to the BER achieved with default fixed programming in curve 606. In these examples, the tProg target is set according to desired system performance, and is maintained to have a stable value by adaptation every cycle range. The BER threshold is selected such that average BER will be successfully handled by the error correction circuitry with hard decoding, in order to guarantee no degradation of the read performance as well.

As further set forth above, the example methods shown in FIGS. 3 and 4 can also permit control of the programming parameters on the controller as a function of the physical row/page that is being programmed.

Figures 7A, 7B:
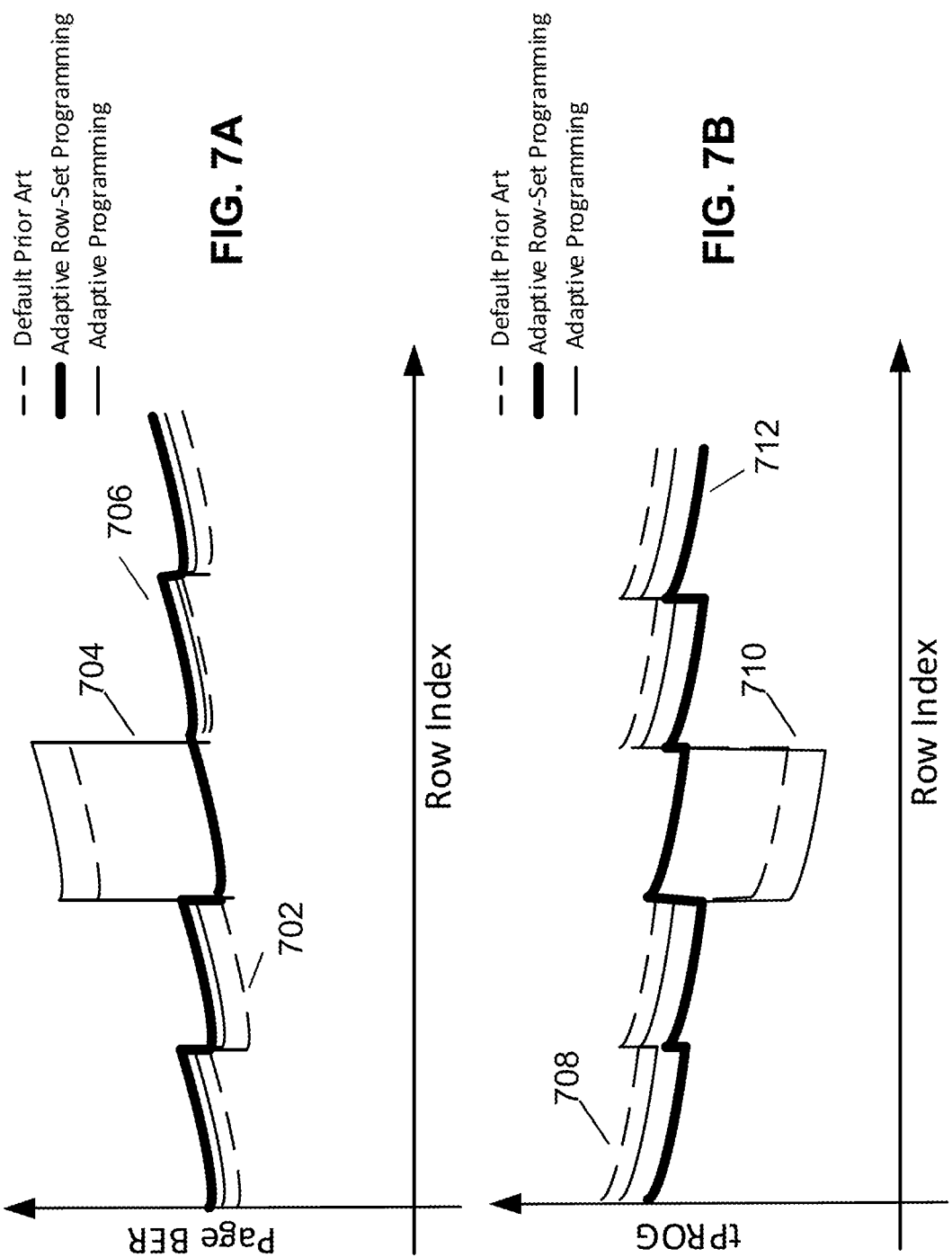
FIGS. 7A and 7B are diagrams illustrating still further example aspects of adapting programming parameters of a flash memory device using the example methodologies of the present embodiments.

FIGS. 7A and 7B illustrate performance of a NAND flash block that is programmed. If it is programmed with fixed parameters as in the conventional case, the programming time variation as function of the row index might be quite significant as shown by curve 708 in FIG. 7B, and thus at high cycle counts this can have a strong impact on the maximal page BER after programming as shown by curve 702 in FIG. 7A. As in the above examples, there is a strong correspondence between the average page BER as function of the row index and the programming time. In particular, as can be seen in comparison between curves 708 and 702, for rows with a very short programming time, a high page BER is measured.

As further shown by curves 704 and 710 in FIGS. 7A and 7B, an adaptive programming which accelerates the programming time with a single set of parameters, improves the tProg on all rows, and as a result also increases the average and maximal page BER. As still further shown by curves 706 and 712 in FIGS. 7A and 7B, a row-set adaptation, where the program time is reduced for one row-set, and increased for another row-set, as described in connection with the methods of FIGS. 3 and 4, yields a reduction in the maximal page BER, and at the same time a reduction in average tProg for the full block.

Table 1 below shows an exemplary set of programming parameters for a memory block obtained per cycle range using the adaptation method of FIG. 3 according to the present embodiments, but without performing the row-set adaptation described above.

TABLE 1

| | Program Parameters | | |
|---|---|---|---|
| Cycles Cycle range | Start program voltage (Vstart) | Max. number of program pulses (NPP) | Program voltage step up (Vstep) |
| 0-1000 | 7 V | 5 | 0.2 V |
| 1000-2000 | 6.7 V | 7 | 0.15 V |
| . | . | . | . |
| . | . | . | . |
| . | . | . | . |
| 19,000-20,000 | 6.1 V | 7 | 0.1 V |

In this example shown in Table 1, adaptation is performed every 1000 P/E cycles. However, this is just one possible example.

Table 2 below shows an exemplary set of programming parameters for a memory block obtained per cycle range using the adaptation method of FIGS. 3 and 4 according to the present embodiments, including performing the row-set adaptation described above.

TABLE 2

| | Program Parameters | | | | | |
|---|---|---|---|---|---|---|
| | Start program voltage (Vstart) | | Max. number of program pulses (NPP) | | Program voltage step up (Vstep) | |
| Cycles Cycle range | RowSet1 0-90 | RowSet2 91-127 | RowSet1 0-90 | RowSet2 91-127 | RowSet1 0-90 | RowSet2 91-127 |
| 0-1000 | 7 V | 6.8 V | 5 | 5 | 0.25 V | 0.15 V |
| 1000-2000 | 6.7 V | 6.5 V | 7 | 8 | 0.2 V | 0.1 V |
| . | . | . | . | . | . | . |
| . | . | . | . | . | . | . |
| . | . | . | . | . | . | . |
| 19,000-20,000 | 6.1 V | 5.9 V | 7 | 8 | 0.15 V | 0.1 V |

Note that this example includes different parameters for different row-sets, such that the controller has to change the parameters during the block programming with respect to each row-set. That is, for rows 0-90 the first column parameters are used for programming the cells in those rows in the block, and for rows 91-127 the second column parameters are used for programming the cells in those rows in the block.

Various alternatives to the example embodiments above will now be described. It should become apparent that many combinations of these alternatives and the previously described embodiments are possible.

In one possible alternative, it is not necessary to perform a determination of optimal programming parameters separately for every block in a memory device. For example, many flash controllers include management software that causes some or all of the blocks of the device to experience nearly equal wear, using techniques known as wear leveling. In some embodiments, when using wear leveling, the overhead of optimizing programming parameters can be reduced by performing parameter adaptation for only a sample block at every P/E cycle range. After performing optimization for the sample block (e.g. using the methodologies of FIG. 3 or 4), the resulting set of programming parameters can be used for some or all of the other blocks in the memory device.

In another possible alternative to the methods of FIGS. 3 and 4, instead of the brute-force incremental parameter adaptation method of steps S304 to S308, it is possible to obtain an optimal set of programming parameters by simultaneously estimating a vector of programming parameters using a delta programming time estimator. This may lead to faster parameter adaptation times in comparison to the embodiments of FIGS. 3 and 4.

Figure 8:
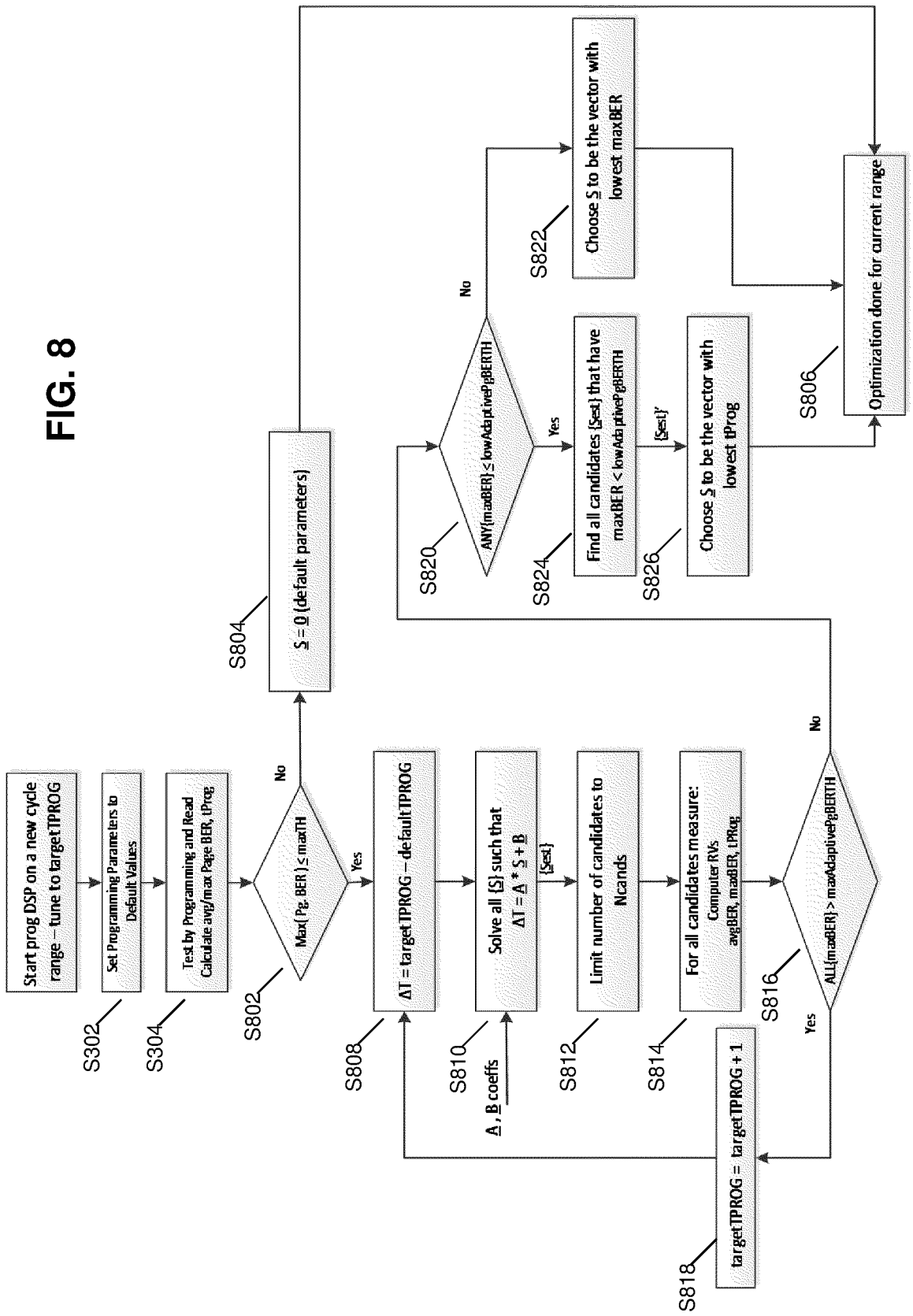
FIG. 8 is a flowchart illustrating an alternative example methodology for adapting programming parameters of a flash memory device according to embodiments.

An example methodology according to these embodiments is shown in FIG. 8. As shown, it includes initial steps S302 and S304 for first programming the memory with default parameters which can be performed similarly as in the methods of FIGS. 3 and 4. Differently, however, a next step S802 after the programming and read operation of step S304, the maximum BER for any page is compared to a threshold. If it is determined in step S802 that the initial programming and read operation using the default parameters results in the maximum page BER being greater than the threshold, the default parameters are set as the programming parameters in step S804 and optimization has been completed in step S806.

Otherwise, if it is determined in step S802 that the maximum page BER is less than the threshold, a process for estimating a vector or programming parameters commences with step S808. In this step, the delta between the target programming time and the programming time using the default programming parameters is determined. The target programming time can be initially set using any of the techniques described above in connection with FIGS. 5 and 6. Next in step S810 a set Sest of estimated programming parameter vectors S (e.g., a vector of values for parameters Vstart, Vstep, NPP, etc.) is determined using the delta programming time. In this example, this is done by finding all solutions for S using the delta programming time, and vector coefficients A and B. These vector coefficients A and B can be obtained from an offline characterization of a large set of devices. For example, coefficient A can represent the linear slope in delta tProg as a function of DAC step for every parameter, and coefficient B can represent a fixed offset per parameter. These coefficients can be saved as constant values and used during the adaptive programming process.

The number of programming parameter vectors in the set Sest is next truncated to a limited number of candidates established by the parameter Ncands in step S812. These candidate vectors are used to program the memory, and for each vector, the read-voltage thresholds (RVs) are computed (in an example case where the default read thresholds are not used and optimal thresholds need to be computed after each modification) in step S814. Also, average BER, maximum BER and programming time are measured in step S814. If all of the maximum BERs are greater than a threshold maxAdaptivePgBERTH as determined in step S816, processing returns to step S808, with the target programming time increased by an increment, for example, by 20 microseconds.

Otherwise, in a next step S820, it is determined whether the maximum BERs for any of the candidate vectors was less than a threshold lowAdaptivePgBERTH. If so, all candidate vectors having a maximum BER less than the threshold are identified in step S824, and the candidate vector with the lowest programming time is selected in S826. Otherwise, the candidate vector with the lowest maximum BER is selected in S822. In either event, the optimization process ends in step S806 with the appropriate candidate vector of programming parameters.

It should be noted that, after completion of step S806, additional parameter adaptation processing can be further performed, commencing with step S312 in FIGS. 3 and 4, for example.

In still another possible alternative, the determination of a tuned set of programming parameters need not be performed over the entire lifetime of the device. Rather, in another possible embodiment, the parameters are tuned during the manufacturing/testing process of the memory device, by performing fast cycling on a single representative block, and adapting the programming parameters for every cycle range and for this single block during this process (e.g. using the methodologies of FIG. 3 or 4). The set of programming parameters for every cycle range can then be saved in a table accessible by the controller. Then, during actual operation of the memory device over its lifetime, the controller can monitor the numbers of cycles as in the above embodiments, and when every new cycle range is reached, the controller can obtain a new set of parameters for use at the cycle range from this table.

In other embodiments in which a table is used during operation of the device instead of dynamically determining parameters as in the previous example, many further alternatives are possible. For example, one alternative is to tune programming parameters only for a first cycle range, for a target BER or other programming performance metric, and then based on the results, changing to different parameters every cycle range using a table index.

Figure 9:
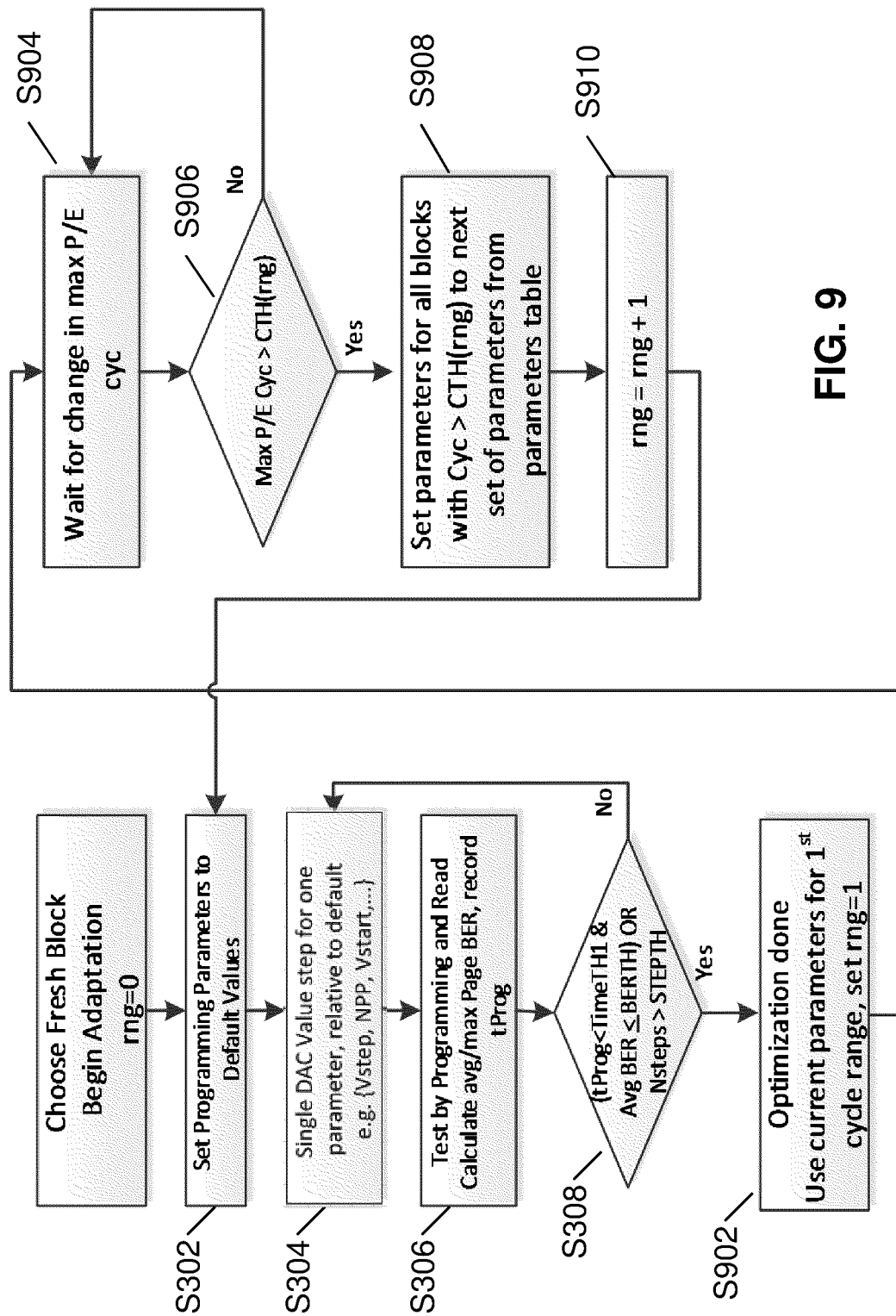
FIG. 9 is a flowchart illustrating another example methodology for adapting programming parameters of a flash memory device according to embodiments.

One example method according to these and other embodiments is illustrated in the flowchart in FIG. 9. As shown in FIG. 9, and differently from the examples shown in FIGS. 3 and 4, the process begins with a fresh block, chosen for example during manufacturing. As further shown, however, programming parameter optimization steps S902 to S908 can be performed as described above in connection with the examples of FIGS. 3 and 4.

The parameters determined after step S908 are used for the first cycle range of the device in step S902. The controller then monitors the cycle counts of all the blocks in step S904 and determines in step S906 whether any of the blocks has reached the next cycle range. If so, in step S908 the controller gets the next set of programming parameters from the table using the current range index. The index is incremented in step S910, and the process flow returns to step S302.

The following Table 4 provides an example programming parameter set to be used in these and other embodiments. In this example, the table includes only 16 distinct sets of parameters and so only a four bit index is required. This index can be saved as meta-data for every physical block, or every set of blocks which have same optimization result.

TABLE 4

Program Parameters Table Stored in Controller

| Index | Start program voltage [V] | Max. number of program pulses | Program voltage step up [V] |
| --- | --- | --- | --- |
| 0 | 5 | 10 | 0.15 |
| 1 | 5.2 | 10 | 0.15 |
| 2 | 5.4 | 10 | 0.15 |
| 3 | 5.6 | 10 | 0.15 |
| 4 | 5.8 | 10 | 0.15 |
| 5 | 6 | 10 | 0.15 |
| 6 | 5 | 9 | 0.2 |
| 7 | 5.2 | 9 | 0.2 |
| 8 | 5.4 | 9 | 0.2 |
| 9 | 5.6 | 9 | 0.2 |
| 10 | 5.8 | 9 | 0.2 |
| 11 | 6 | 9 | 0.2 |
| 12 | 5 | 8 | 0.25 |
| 13 | 5.4 | 8 | 0.25 |
| 14 | 5.8 | 8 | 0.25 |
| 15 | 6.2 | 8 | 0.25 |

Various alternatives can be used rather than incrementing an index as shown in FIG. 8. For example, it may be possible to determine a new set of programming parameters based on an ordered search over predetermined values stored in a table at the controller. This can be done by first selecting all table entries for which the delta programming time estimation such as that described above in connection with FIG. 8 corresponds to a change in target programming time being needed. In another example, at every cycle range, the search for the next set of parameters can start at the entry of current program parameters, and a search can be performed using single steps in a fixed direction (e.g., according to a required tProg change). The required tProg change can be measured by subtracting the current programming time from the target programming time. As another embodiment of the invention, when using a set of parameters from a given table, different sets of blocks on the same die can be programmed with different parameters, giving rise to fixed/variable adaptation of programming parameters across the device, even under similar wear conditions.

It should be noted that embodiments where parameters are adapted dynamically such as the embodiments described in connection with FIGS. 3 and 4 and embodiments where parameters are adapted using a table such as Table 4 above are not necessarily exclusive. For example, in some embodiments, parameters that are dependent on each other can be adapted using values from a table and parameters that are not dependent on other parameters can be adapted dynamically, for example using an optimization approach described in connection with FIGS. 3 and 4.

Figure 10:
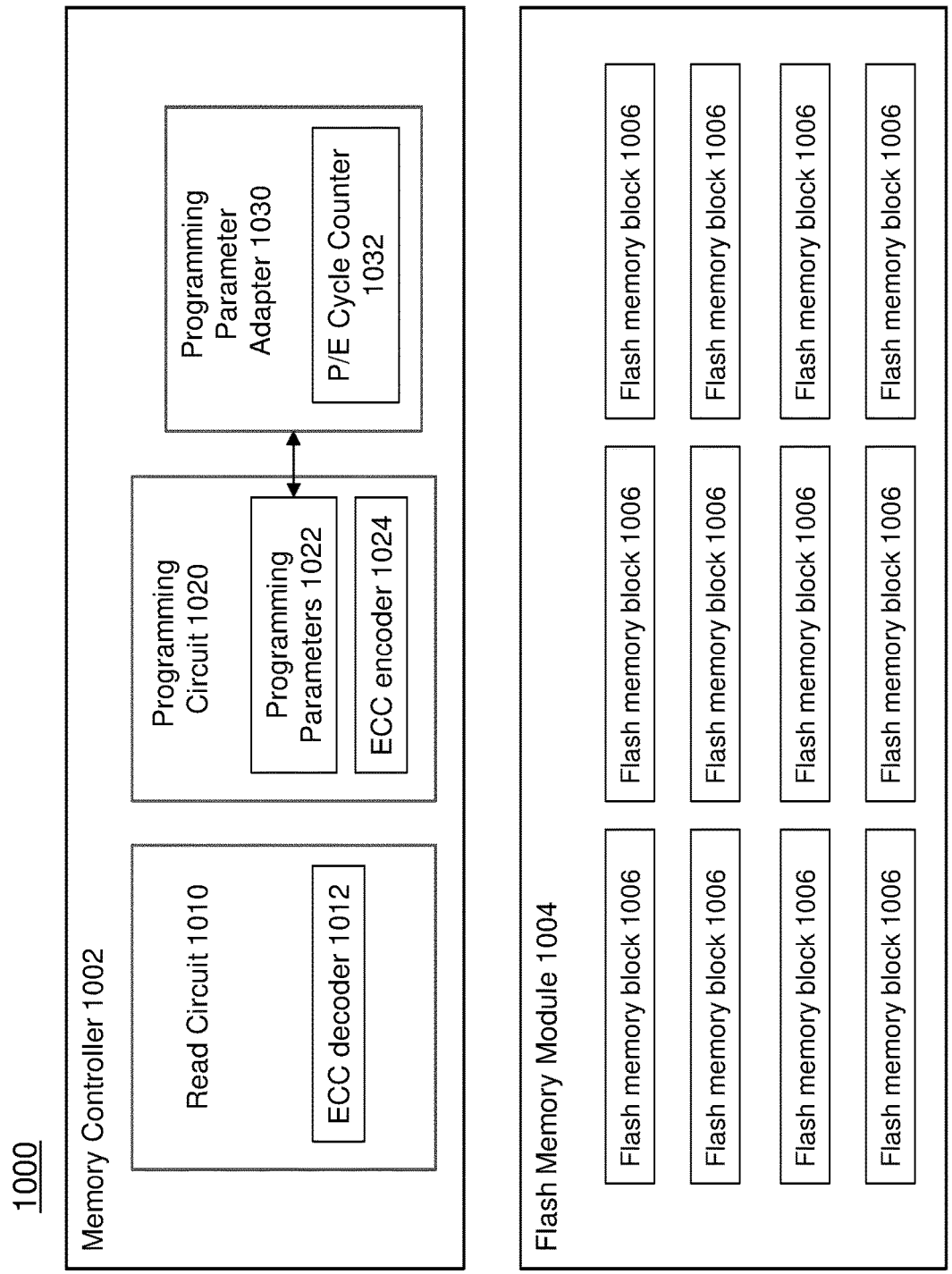
FIG. 10 is a block diagram illustrating an example flash memory device according to embodiments.

FIG. 10 illustrates an example device 1000 according to an embodiment of the invention, which can perform any of the methods described above or a combination thereof.

Device 1000 includes a flash memory module 1004 and a memory controller 1002. The flash memory module 1004 includes multiple flash memory blocks 1006, each of which includes multiple flash memory rows/pages (not shown). Additionally or alternatively, module 1004 can comprise or be implemented using a plurality of dies, each of the dies containing a plurality of the blocks 1006.

The memory controller 1002 includes a read circuit 1010, a programming circuit (e.g. a program DSP) 1020 and a programming parameter adapter 1030. As shown, adapter 1030 can adapt the programming parameters 1022 used by programming circuit 1020 as described above. Adapter 1030 in this example includes a P/E cycle counter 1032, which can perform any of the cycle counting or estimation techniques described above. Although shown separately for ease of illustration, some or all of adapter 1030 can be incorporated in programming circuit 1020. In accordance with some aspects of the embodiments described above, read circuit 1010 includes an ECC decoder 1012 and programming circuit 1020 includes an ECC encoder 1024. Embodiments of memory controller 1002 can include additional or fewer components such as those shown in FIG. 10.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method comprising:
monitoring programming operations of a flash memory device, the programming operations being performed in accordance with a plurality of programming parameters;
based on the monitoring, performing an adaptation operation on the plurality of programming parameters, wherein the adaptation operation includes:
performing at least first and second adaptive programming operations on the flash memory device respectively using at least first and second changed values of the programming parameters, and
determining, based on the at least first and second adaptive programming operations, adapted values of the programming parameters that maintain a programming performance condition.

2. The method of claim 1, wherein monitoring the programming operations includes maintaining a count of a number of programming and erase cycles, and wherein performing the adaptation operation is based on the count exceeding a threshold.

3. The method of claim 2, wherein the threshold corresponds to a range of programming and erase cycles of the flash memory device.

4. The method of claim 1, wherein monitoring the programming operations includes estimating a first number of programming and erase cycles using one of an average programming time or a second number of programming errors, and wherein performing the adaptation operation is based on the first or second number exceeding a threshold.

5. The method of claim 1, wherein the plurality of programming parameters include one or more of a start program voltage, a maximum number of pulses, and a program voltage pulse step.

6. The method of claim 1, wherein performing the adaptation operation includes:
changing a value of one of the programming parameters;
programming the memory device with the one programming parameter having the changed value; and
determining if a desired level of the programming performance condition is met in connection with the programming.

7. The method of claim 6, wherein performing the adaptation includes obtaining the changed value for the one programming parameter from a stored table.

8. The method of claim 7, wherein the stored table is prepared by performing a fast cycling operation on a representative block of the memory device.

9. The method of claim 1, wherein the performance condition is a programming time threshold.

10. The method of claim 1, wherein the performance condition is a bit error rate (BER) threshold.

11. The method of claim 1, wherein performing the adaptation operation includes:
estimating a plurality of sets of candidate values of the plurality of programming parameters;
programming the memory device with the plurality of sets of candidate values of the plurality of programming parameters; and
selecting one of the plurality of sets of candidate values based on the programming performance condition in connection with the programming.

12. A flash memory system comprising:
a flash memory comprising a plurality of dies; and
a controller configured to perform programming operations on the flash memory, the controller including a programming circuit and a programming parameter adapter configured to:
monitor programming operations performed on the flash memory by the programming circuit, the programming operations being performed in accordance with a plurality of programming parameters; and
based on the monitoring, perform an adaptation operation on the plurality of programming parameters, wherein the adaptation operation includes:
performing at least first and second adaptive programming operations on the flash memory device respectively using at least first and second changed values of the programming parameters, and
determining, based on the at least first and second adaptive programming operations, adapted values of the programming parameters that maintain a programming performance condition.

13. The flash memory system of claim 12, wherein the monitoring is performed separately for each of the plurality of dies.

14. The flash memory system of claim 12, wherein changing values of one or more of the programming parameters is performed separately for each of the plurality of dies.

15. The flash memory system of claim 14, wherein the flash memory device is a NAND-type flash memory.

16. The flash memory system of claim 12, wherein each of the plurality of dies comprises a plurality of blocks, and wherein adaptation of the plurality of programming parameters is performed separately for each of the plurality of blocks.

17. The flash memory system of claim 16, wherein each of the plurality blocks includes a plurality of rows, and wherein adaptation of the plurality of programming parameters of each block is performed separately for two or more sets of the plurality of rows.

18. The flash memory system of claim 12, wherein each of the plurality of dies comprises a plurality of blocks, and wherein adaptation of the plurality of programming parameters is performed on one of the blocks and the adapted programming parameters resulting from the adaptation performed on the one of the blocks are then applied to the other of the plurality of blocks.

19. The flash memory system of claim 18, wherein each of the plurality blocks includes a plurality of rows, and wherein the adapted programming parameters from the adaptation performed on the one of the blocks are applied to one or more of the plurality of rows.

20. The flash memory system of claim 18, wherein the plurality of programming parameters include one or more of a start program voltage, a maximum number of pulses, and a program voltage pulse step.

\* \* \* \* \*